(12) United States Patent
Suk et al.

(10) Patent No.: US 12,720,793 B2
(45) Date of Patent: Aug. 25, 2026

(54) SINGLE PROCESS DOUBLE GATE AND VARIABLE THRESHOLD VOLTAGE MOSFET

(71) Applicant: International Business Machines Corporation, Armonk, NY (US)

(72) Inventors: Sung Dae Suk, Watervliet, NY (US); Devendra K. Sadana, Pleasantville, NY (US); Tze-Chiang Chen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 17/521,083

(22) Filed: Nov. 8, 2021

(65) Prior Publication Data

US 2023/0147329 A1 May 11, 2023

(51) Int. Cl.
*H10D 30/62* (2025.01)
*H10D 30/01* (2025.01)

(52) U.S. Cl.
CPC ........... *H10D 30/62* (2025.01); *H10D 30/024* (2025.01); *H10D 30/6219* (2025.01)

(58) Field of Classification Search
CPC .. H10D 30/62; H10D 30/024; H10D 30/6219; H10D 30/0323; H10D 30/6734; H10D 30/6744; H10D 30/6735; H10D 30/43–435; H10D 30/014; H10D 30/6731; H10D 30/6739; H10D 30/673–6736; H10D 30/875; H10D 30/0215; H10D 64/017; H10D 64/605; H10D 64/665–669; H10D 62/119–123; Y10S 977/938; H10K 10/464; H01L 21/28097; H01L 21/28061;
(Continued)

(56) References Cited

U.S. PATENT DOCUMENTS

| | | | |
|---|---|---|---|
| 5,814,899 | A | 9/1998 | Okumura et al. |
| 5,892,260 | A | 4/1999 | Okumura et al. |
| 6,798,017 | B2 | 9/2004 | Furukawa et al. |

(Continued)

FOREIGN PATENT DOCUMENTS

| | | |
|---|---|---|
| WO | 2023/079037 A1 | 5/2023 |

OTHER PUBLICATIONS

International Search Report and Written Opinion for PCT/EP2022/080741 dated Feb. 13, 2023 (12 pages).

(Continued)

*Primary Examiner* — Steven B Gauthier
*Assistant Examiner* — Adam D Weiland
(74) *Attorney, Agent, or Firm* — Edward J. Wixted, III

(57) ABSTRACT

Double gate/gate-all-around and variable threshold voltage MOSFET devices and techniques for fabrication thereof in a single backside process are provided. In one aspect, a MOSFET device includes: a channel in between source/drain regions; at least one first gate disposed on a first side of the channel at a frontside of the MOSFET device; gate spacers offsetting the source/drain regions from the at least one first gate; and at least one second gate disposed on a second side of the channel directly opposite the at least one first gate at a backside of the MOSFET device. At least one gate contact can be present in direct contact with the at least one first gate and the at least one second gate. A method of forming a MOSFET device is also provided.

20 Claims, 18 Drawing Sheets

(58) Field of Classification Search
CPC ......................... H01L 21/28079–28088; H01L 21/32051–32053
See application file for complete search history.

(56) References Cited

U.S. PATENT DOCUMENTS

| | | | | |
|---|---|---|---|---|
| 7,176,089 | B2 | 2/2007 | Furukawa et al. | |
| 8,034,687 | B2 | 10/2011 | Gurtej et al. | |
| 9,343,440 | B2 | 5/2016 | McDonald et al. | |
| 9,524,932 | B2 | 12/2016 | Munding et al. | |
| 9,601,512 | B2 | 3/2017 | Zang et al. | |
| 10,037,919 | B1 | 7/2018 | Xie et al. | |
| 10,361,128 | B2 | 7/2019 | Anderson et al. | |
| 10,529,716 | B1 | 1/2020 | Lee et al. | |
| 2002/0093053 | A1 | 7/2002 | Chan et al. | |
| 2005/0280088 | A1* | 12/2005 | Min | H10D 30/6734 257/E29.281 |
| 2006/0022264 | A1* | 2/2006 | Mathew | H10D 30/0323 257/E21.415 |
| 2009/0011562 | A1 | 1/2009 | Licitra et al. | |
| 2011/0127608 | A1* | 6/2011 | Cheng | H01L 21/76251 438/157 |
| 2021/0083122 | A1* | 3/2021 | Naylor | H10D 30/6755 |
| 2021/0375858 | A1* | 12/2021 | Chiang | H10D 30/6735 |
| 2022/0238719 | A1* | 7/2022 | Yamazaki | H10D 84/038 |
| 2022/0294402 | A1* | 9/2022 | Takahashi | H03K 5/08 |
| 2022/0344510 | A1* | 10/2022 | Tsai | H10D 30/6734 |
| 2023/0017100 | A1* | 1/2023 | Liaw | H10D 30/6215 |
| 2023/0036522 | A1* | 2/2023 | Chen | H10D 84/0149 |

OTHER PUBLICATIONS

Erben et al., “Work Function Setting in High-k Metal Gate Devices,” Complementary Metal Oxide Semiconductor, Chapter 3, pp. 27-40 (Aug. 2018).

C. Kothandaraman et al., “Vertical channel devices enabled by through silicon via (TSV) technologies,” International Electron Devices Meeting (IEDM), Dec. 2016, 9.6 (4 pages).

* cited by examiner 502
202a
106
104
102
B-B′

104
A
202a
902
B
B′
106′
602
A′

1002
106′
202a
104
102
A-A′

(follows from FIG. 13)

SINGLE PROCESS DOUBLE GATE AND VARIABLE THRESHOLD VOLTAGE MOSFET

FIELD OF THE INVENTION

The present invention relates to metal oxide semiconductor field-effect transistor (MOSFET) devices, and more particularly, to double gate/gate-all-around (GAA) and variable threshold voltage MOSFET devices and techniques for fabrication thereof in a single backside process.

BACKGROUND OF THE INVENTION

A metal oxide semiconductor field-effect transistor (MOSFET) device generally includes source/drain regions interconnected by a channel, and at least one gate that regulates current flow through the channel. As its name implies, a multi-gate MOSFET device incorporates more than one gate into a single device design. Such multi-gate designs are being explored for scaled MOSFET technology.

The implementation of a multi-gate MOSFET device design provides some notable benefits. For instance, employing multiple gates that at least partially surround the channel in a gate-all-around or GAA configuration provides improved channel control, which enhances device performance as compared to its single gate counterparts.

Further, a multi-gate MOSFET device design can be leveraged to form variable threshold voltage MOSFET devices where gates having different threshold voltages are incorporated into a single device. Implementation of a variable threshold voltage MOSFET design advantageously lowers the standby power of the device.

However, there are significant challenges associated with manufacturing multi-gate MOSFET devices. Namely, conventional approaches to producing this design include patterning steps involving complex lithography and etching schemes which are time-consuming and costly to implement in a large-scale manufacturing setting.

Thus, improved techniques for manufacturing multi-gate GAA and variable threshold voltage MOSFET devices would be desirable.

SUMMARY OF THE INVENTION

The present invention provides double gate/gate-all-around (GAA) and variable threshold voltage metal oxide semiconductor field-effect transistor (MOSFET) devices and techniques for fabrication thereof in a single backside process. In one aspect of the invention, a MOSFET device is provided. The MOSFET device includes: a channel in between source/drain regions; at least one first gate disposed on a first side of the channel at a frontside of the MOSFET device; gate spacers offsetting the source/drain regions from the at least one first gate; and at least one second gate disposed on a second side of the channel directly opposite the at least one first gate at a backside of the MOSFET device.

In another aspect of the invention, another MOSFET device is provided. The MOSFET device includes: a channel in between source/drain regions; at least one first gate disposed on a first side of the channel at a frontside of the MOSFET device; gate spacers offsetting the source/drain regions from the at least one first gate; at least one second gate disposed on a second side of the channel directly opposite the at least one first gate at a backside of the MOSFET device; and at least one gate contact in direct contact with the at least one first gate and the at least one second gate.

In yet another aspect of the invention, a method of forming a MOSFET device is provided. The method includes: forming at least one sacrificial gate on a first side of a channel at a frontside of the MOSFET device; forming gate spacers alongside the at least one sacrificial gate; forming source/drain regions on opposite sides of the at least one sacrificial gate, offset from the at least one sacrificial gate by the gate spacers; removing and replacing the at least one sacrificial gate with at least one first gate; and forming at least one second gate on a second side of the channel directly opposite the at least one first gate at a backside of the MOSFET device.

A more complete understanding of the present invention, as well as further features and advantages of the present invention, will be obtained by reference to the following detailed description and drawings.

DETAILED DESCRIPTION OF PREFERRED EMBODIMENTS

A multi-gate metal oxide semiconductor field-effect transistor (MOSFET) device such as a double gate MOSFET device employs multiple gates that at least partially surround a channel of the device in what is referred to herein as a gate-all-around or GAA configuration. A GAA configuration advantageously improves channel control and enhances device performance. Further, varying the threshold voltages of the gates can be used to form a variable threshold voltage MOSFET device, which can advantageously lower the standby power of the device. However, as provided above, conventional approaches to multi-gate MOSFET fabrication often involve complex patterning schemes.

Provided herein are techniques for fabricating double gate MOSFET devices using a backside process which advantageously permits the formation of GAA and variable threshold voltage MOSFET devices to be fabricated using the same process. As will become apparent from the description that follows, the term 'backside process' refers to the bonding of the partially-completed device (including one of the double gates) to a control wafer and flipping over of the structure to enable completion of the device (including the other double gate) at the backside. Notably, the same general backside process is used to produce both GAA and variable threshold voltage MOSFET devices simply by configuring the gates and the gate contacts accordingly. For instance, as will be described in detail below, employing a common contact for the dual gates creates a GAA high performance MOSFET, while employing gates having different threshold voltages and contacting the gates separately creates a variable threshold voltage MOSFET for low power applications.

Given the above overview, an exemplary methodology for forming a double gate MOSFET device in accordance with the present techniques is now described by way of reference to FIGS. 1-17. In the description that follows, reference will be made to various views of the device structure throughout the different stages of the fabrication process, including top-down and cross-sectional views. For instance, FIG. 1A is a top-down diagram, and FIG. 1B depicts a cross-sectional cut along line A-A' through the structure shown in FIG. 1A.

According to an exemplary embodiment, the starting platform for the process is a semiconductor-on-insulator (SOI) wafer. See FIGS. 1A and 1B. As shown in FIGS. 1A and 1B, a SOI wafer includes an SOI layer 106 separated from an underlying substrate 102 by a buried insulator 104. When the buried insulator is an oxide it is also referred to herein as a buried oxide or BOX. The SOI layer can include any suitable semiconductor material(s), such as silicon (Si), germanium (Ge), silicon germanium (SiGe) and/or a III-V semiconductor.

Figure 1A:
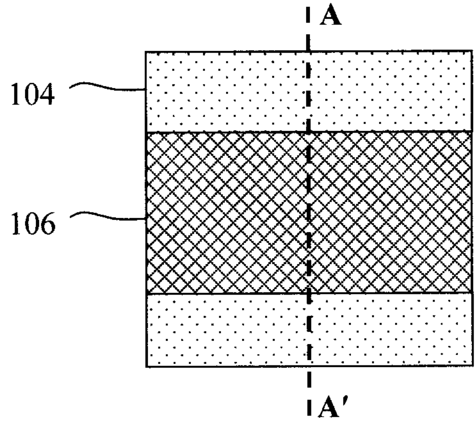
FIG. 1A is a top-down diagram illustrating a semiconductor-on-insulator (SOI) layer of an SOI wafer having been patterned to form at least one active area of a metal oxide semiconductor field-effect transistor (MOSFET) device.
Figure 1B:
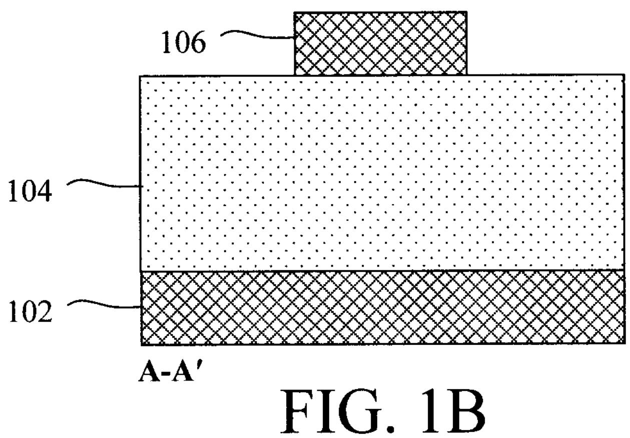
FIG. 1B is an A-A' cross-sectional view illustrating the SOI layer having been patterned to form the at least one active area of the MOSFET device according to an embodiment of the present invention.

As shown in FIGS. 1A and 1B, the SOI layer 106 has been patterned to form at least one active area of the device. The term 'active area(s)' as used herein refers to the portion(s) of the SOI layer 106 (defined here by pattering) that will serve as the channel of the present double gate MOSFET device. By way of example only, standard lithography and etching techniques can be employed to pattern the SOI layer 106. With standard lithography and etching techniques, a lithographic stack (not shown), e.g., photoresist/anti-reflective coating (ARC)/organic planarizing layer (OPL), is used to pattern a hardmask (not shown) with the footprint and location of the active area(s) of the device. Suitable fin hardmask materials include, but are not limited to, oxide hardmask materials such as silicon oxide (SiOx) and/or nitride hardmask materials such as silicon nitride (SiN), silicon oxynitride (SiON) and/or silicon carbide nitride (SiCN). An etch is then performed to transfer the pattern from the hardmask to the underlying SOI layer 106. A directional (i.e., anisotropic) etching process such as RIE can be employed to pattern the SOI layer 106.

A dielectric material 202 is then deposited onto the buried insulator 104 over the SOI layer 106. See FIG. 2 (an A-A' cross-sectional view). Suitable dielectric materials 202 include, but are not limited to, nitride materials such as SiN, SiON and/or SiCN, which can be deposited using a process such as chemical vapor deposition (CVD), atomic layer deposition (ALD) or physical vapor deposition (PVD). According to an exemplary embodiment, the dielectric material 202 has a thickness of from about 5 nanometers (nm) to about 20 nm and ranges therebetween.

Figure 2:
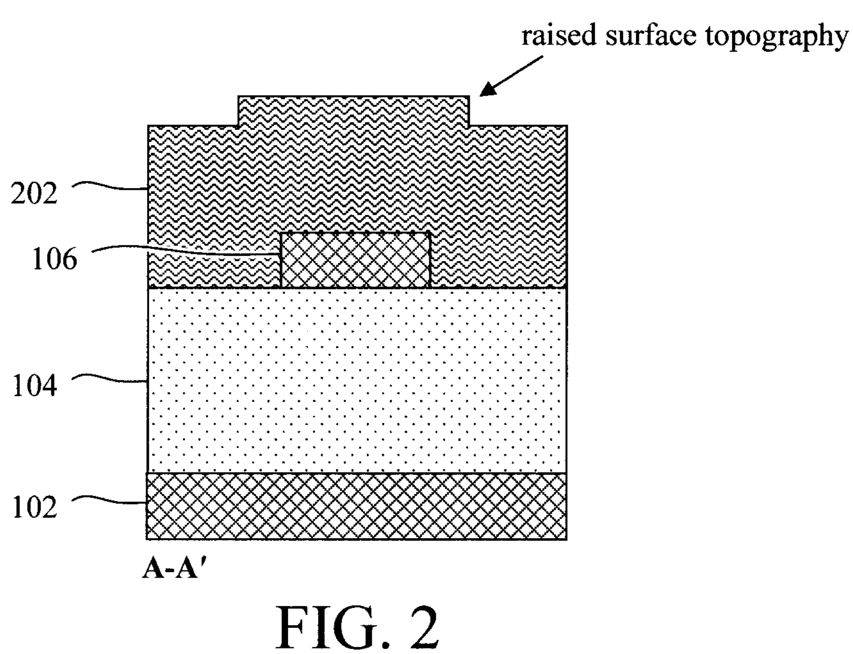
FIG. 2 is an A-A' cross-sectional view illustrating a dielectric material having been deposited over the (patterned) SOI layer according to an embodiment of the present invention.
Figure 3:
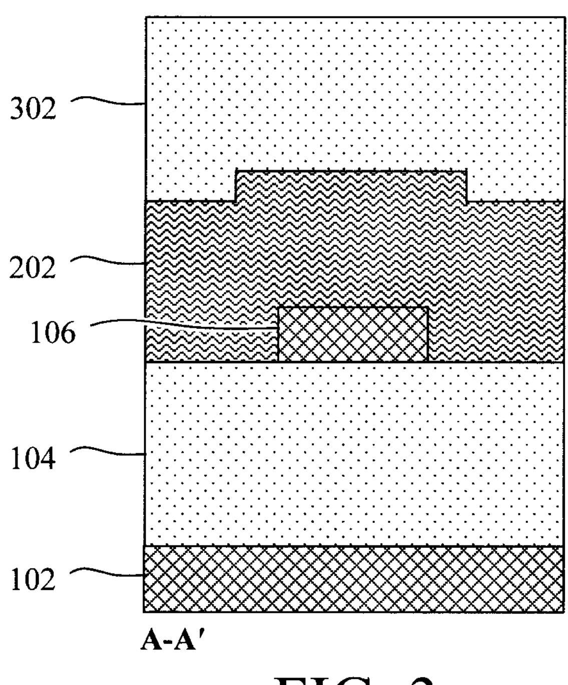
FIG. 3 is an A-A' cross-sectional view illustrating a planarizing dielectric layer having been deposited onto the dielectric material according to an embodiment of the present invention.

As shown in FIG. 2, depositing the dielectric material 202 in this manner can result in a surface topography where the dielectric material 202 is raised over the (patterned) SOI layer 106. Thus, a planarizing dielectric layer 302 is next deposited onto the dielectric material 202. See FIG. 3 (an A-A' cross-sectional view). Suitable planarizing dielectric materials include, but are not limited to, OPL materials and/or spin-on-glass which can be deposited using a casting process such as spin casting or spray casting. A planarizing dielectric has good gap-fill properties and provides planarity as shown in FIG. 3.

Figure 4:
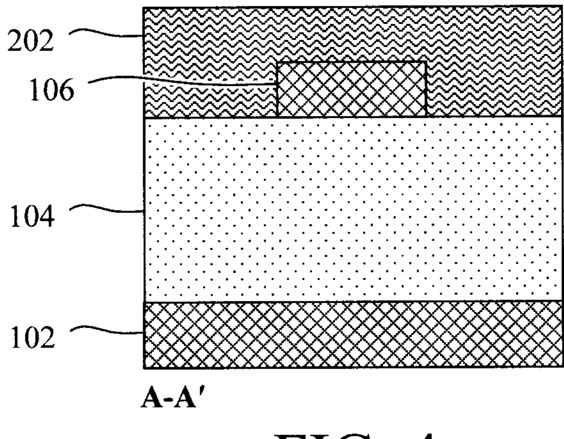
FIG. 4 is an A-A' cross-sectional view illustrating a recess of the dielectric material having been performed which fully removes the planarizing dielectric layer and a surface topography of the dielectric material over the (patterned) SOI layer according to an embodiment of the present invention.

Providing a planar surface enables a recess of the dielectric material 202 using a process such as chemical-mechanical polishing (CMP). See FIG. 4 (an A-A' cross-sectional view). As shown in FIG. 4, the planarizing dielectric layer 302 has been fully removed by this process, as has the surface topography of the dielectric material 202 over the (patterned) SOI layer 106.

In the present example, a gate-last approach may be employed. With a gate-last approach, sacrificial gates are formed early on in the process and serve as placeholders during source/drain region formation. The term 'sacrificial' as used herein generally refers to any structure that is removed, in whole or in part, during fabrication of the device. Later on, the sacrificial gates are removed and replaced with the final gates of the device. Doing so advantageously avoids exposing the materials of these 'replacement' gates to potentially damaging conditions such as the high temperatures used during formation of the source/drain regions. For instance, replacement metal gate (RMG) stacks can employ a high-κ material as a gate dielectric. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). High-κ materials can become damaged by high temperature anneals. Thus, by forming the gate late in the process, any potential for high temperature damage of the gate stack materials can be avoided altogether.

To begin the gate-last process, at least one sacrificial gate 502 is next formed on the dielectric material 202 over the (patterned) SOI layer 106. See FIG. 5A (a top-down view), FIG. 5B (an A-A' cross-sectional view), and FIG. 5C (a B-B' cross-sectional view). Namely, the view shown in FIG. 5C depicts a cross-sectional cut along line B-B' through the structure shown in FIG. 5A, which is perpendicular to the A-A' cross-sectional view.

Suitable materials for the sacrificial gate(s) 502 include, but are not limited, to polysilicon (poly-Si) and/or amorphous silicon (a-Si), which can be deposited using a process such as CVD, ALD or PVD. Standard lithography and etching techniques (see above) can then be employed to pattern the sacrificial gate material into the individual sacrificial gate(s) 502 shown in FIGS. SA-C. The sacrificial gate(s) 502 is/are formed over a channel region of the device.

Figure 5A:
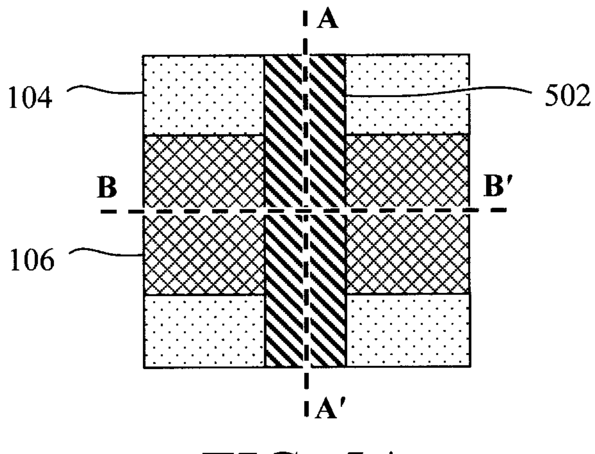
FIG. 5A is a top-down diagram illustrating sacrificial gate(s) having been formed on the dielectric material over the (patterned) SOI layer.
Figures 5B, 5C:
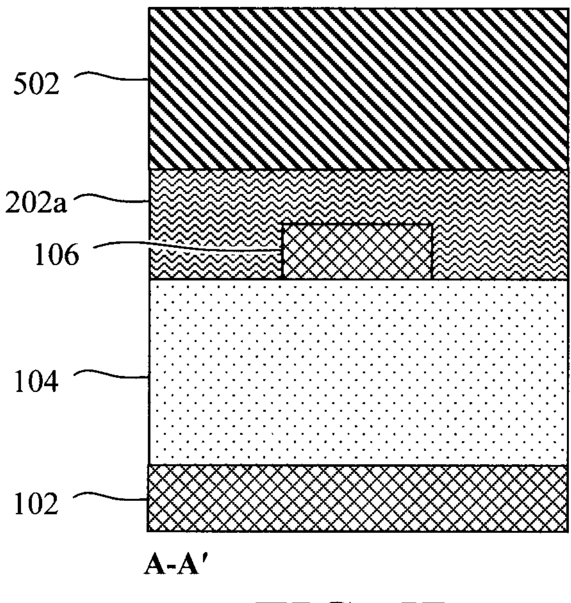
FIG. 5B is an A-A' cross-sectional view illustrating the sacrificial gate(s) having been formed on the dielectric material over the (patterned) SOI layer.
FIG. 5C is a B-B' cross-sectional view illustrating the sacrificial gate(s) having been formed on the dielectric material over the (patterned) SOI layer and the underlying dielectric material having been patterned according to an embodiment of the present invention.

As show for example in FIG. 5C, the dielectric material 202 underlying the sacrificial gate(s) 502 is also patterned in this step. The as-patterned dielectric material 202 is now given the reference numeral 202*a*. A series of selective etching steps can be used to pattern the sacrificial gate(s) 502 and the dielectric material 202. For instance, by way of example only, a poly-Si or a-Si selective etching process such as a poly-Si or a-Si selective RIE can be employed to pattern the sacrificial gate(s) 502. A nitride-selective etching process such as a nitride selective RIE can then be employed to transfer the pattern to the dielectric material 202. As such, the patterned dielectric material 202*a* is not visible in the top-down view shown in FIG. 5A since it is beneath the sacrificial gate(s) 502.

Gate spacers 602 are then formed alongside the sacrificial gate(s) 502. See FIG. 6 (a B-B' cross-sectional view). Suitable materials for the gate spacers 602 include, but are not limited to, oxide spacer materials such as silicon oxide (SiOx) and/or silicon oxycarbide (SiOC) and/or nitride spacer materials such as SiN, silicon-boron-nitride (SiBN), siliconborocarbonitride (SiBCN) and/or silicon oxycarbonitride (SiOCN), which can be deposited onto the sacrificial gate(s) 502 using a process such as CVD, ALD or PVD. A directional (i.e., anisotropic) etching process such as RIE can then be employed to pattern the gate spacer material into the individual gate spacers 602 shown in FIG. 6. According to an exemplary embodiment, the gate spacers 602 have a thickness of from about 3 nm to about 10 nm and ranges therebetween.

Figures 6, 7:
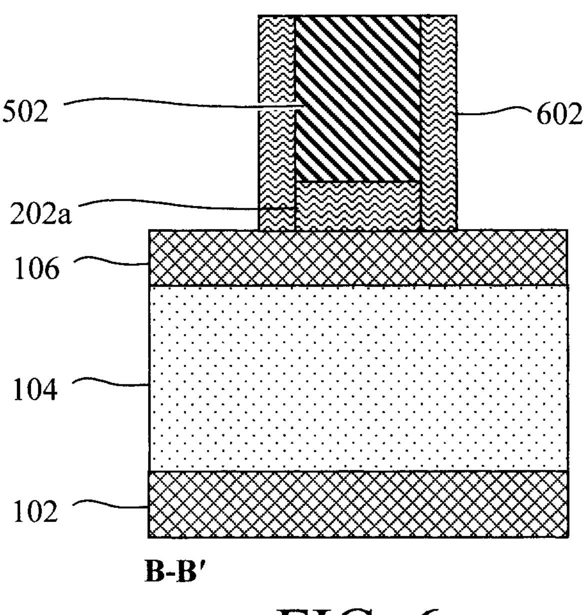
FIG. 6 is a B-B' cross-sectional view illustrating gate spacers having been formed alongside the sacrificial gate(s) according to an embodiment of the present invention.
FIG. 7 is a B-B' cross-sectional view illustrating source/drain regions having been formed in the SOI layer on opposite sides of the sacrificial gate(s), offset from the sacrificial gate(s) by the gate spacers according to an embodiment of the present invention.

Source/drain regions 702 are then formed in the SOI layer 106 on opposite sides of the sacrificial gate(s) 502. See FIG. 7 (a B-B' cross-sectional view). The SOI layer now present in between the source/drain regions 702 will serve as a channel of the device that interconnects the source/drain regions 702 and is hereinafter given the reference numeral 106'. According to an exemplary embodiment, source/drain regions 702 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. grown on the SOI (channel) layer 106' at the base of the sacrificial gate(s) 502. Suitable n-type dopants include, but are not limited to, phosphorous (P) and/or arsenic (As). Suitable p-type dopants include, but are not limited to, boron (B). As shown in FIG. 7, the gate spacers 602 offset the source/drain regions 702 from the sacrificial gate(s) 502.

Figures 8, 9A:
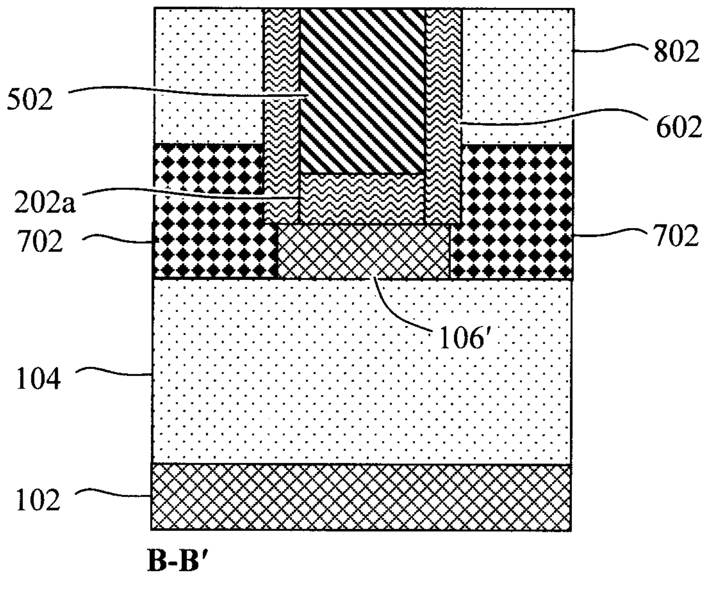
FIG. 8 is a B-B' cross-sectional view illustrating the sacrificial gate(s)/gate spacers and source/drain regions having been buried in an interlayer dielectric (ILD) according to an embodiment of the present invention.
FIG. 9A is a top-down diagram illustrating the sacrificial gate(s) and patterned dielectric material having been selectively removed forming a gate trench(es) in the ILD between the gate spacers.
Figure 9B:
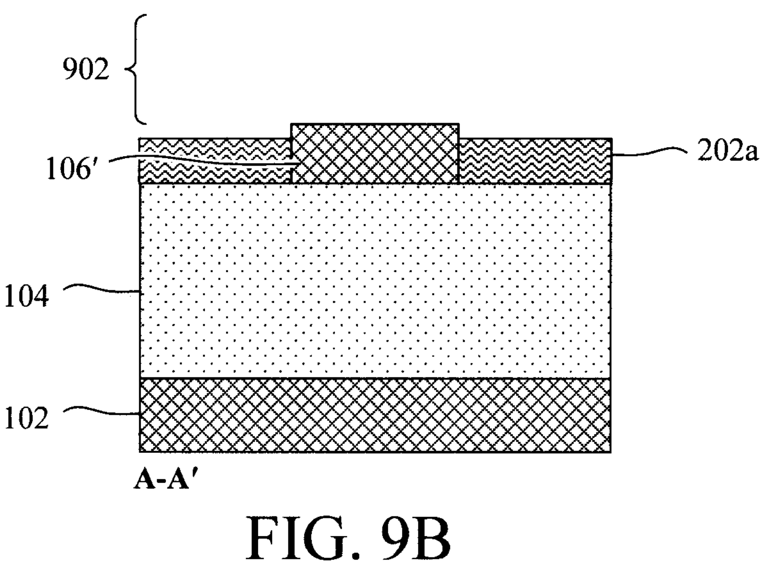
FIG. 9B is an A-A' cross-sectional view illustrating the sacrificial gate(s) and patterned dielectric material having been selectively removed forming a gate trench(es) in the ILD between the gate spacers.
Figure 9C:
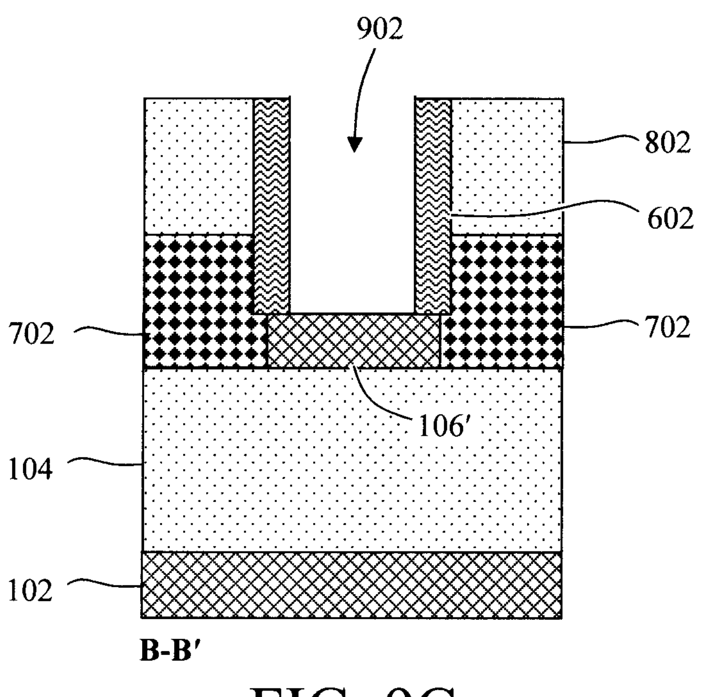
FIG. 9C is a B-B' cross-sectional view illustrating the sacrificial gate(s) and patterned dielectric material having been selectively removed forming a gate trench(es) in the ILD between the gate spacers according to an embodiment of the present invention.
Figures 10A, 10B:
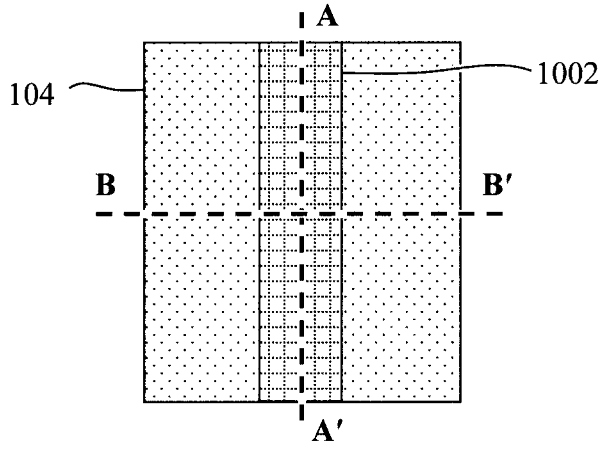
FIG. 10A is a top-down diagram illustrating (first) gate(s) having been formed in the gate trench(es)
FIG. 10B is an A-A' cross-sectional view illustrating the first gate(s) having been formed in the gate trench(es)
Figure 10C:
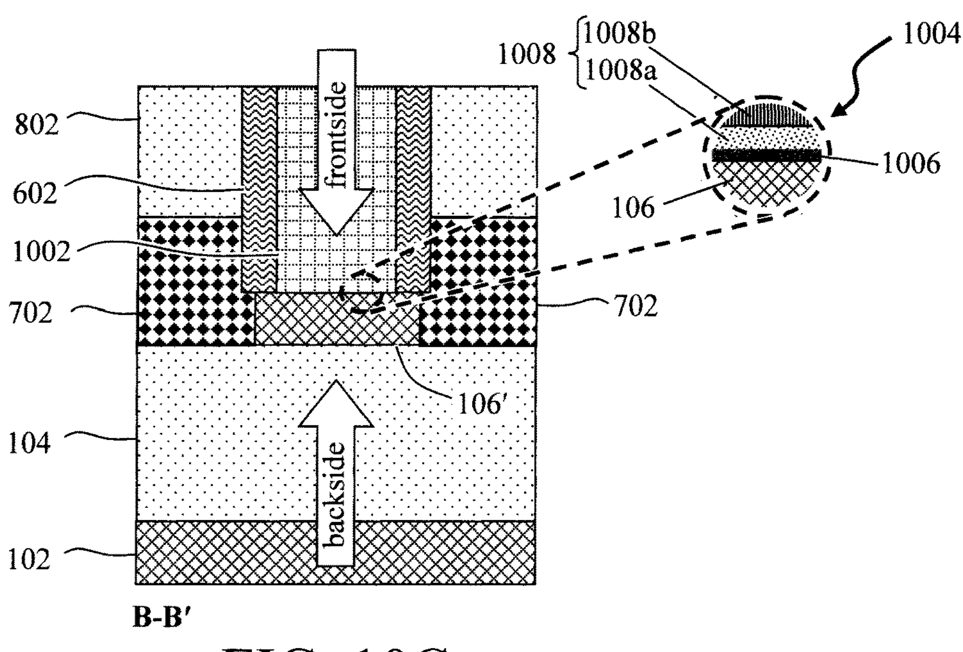
FIG. 10C is a B-B' cross-sectional view illustrating the first gate(s) having been formed in the gate trench(es) according to an embodiment of the present invention.

The sacrificial gate(s) 502/gate spacers 602 and source/drain regions 702 are then buried in an interlayer dielectric (ILD) 802. See FIG. 8 (a B-B' cross-sectional view). Suitable ILD 802 materials include, but are not limited to, oxide materials such as SiOx and/or organosilicate glass (SiCOH) and/or ultralow-K interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 802. As shown in FIG. 8, the as-deposited ILD 802 can be polished down to the top surface of the sacrificial gate(s) 502 and gate spacers 602, e.g., using a process such as CMP. Doing so will enable the selective removal of the sacrificial gate(s) 502.

Namely, the sacrificial gate(s) 502 and patterned dielectric material 202*a* are then selectively removed forming a gate trench(es) 902 in the ILD 802 between the gate spacers 602. See FIG. 9A (a top-down view), FIG. 9B (an A-A' cross-sectional view), and FIG. 9C (a B-B' cross-sectional view). By way of example only, the sacrificial gate(s) 502 and patterned dielectric material 202*a* can be removed using a non-directional (i.e., isotropic) etching process such as a wet chemical etch or a gas phase etch. For instance, a poly-Si or a-Si selective isotropic etching process can be employed to remove the sacrificial gate(s) 502 with the patterned dielectric material 202*a* acting as an etch stop. A nitride-selective isotropic etching process can then be employed to remove the remaining patterned dielectric material 202*a*. A dotted line is used to indicate the outline of the gate trench(es) 902 in FIG. 9A. From the top-down perspective in FIG. 9A, it can be seen that the SOI (channel) layer 106' is now exposed at the bottom of the gate trench(es) 902.

A replacement gate(s) (referred to herein simply as gate(s) 1002) is/are then formed in the gate trench(es) 902. See FIG. 10A (a top-down view), FIG. 10B (an A-A' cross-sectional view), and FIG. 10C (a B-B' cross-sectional view). As shown in magnified view 1004, according to an exemplary embodiment, each of the gate(s) 1002 includes a gate dielectric 1006 and a gate conductor 1008 disposed on the gate dielectric 1006. Although not explicitly shown, a thin (e.g., from about 0.3 nm to about 5 nm) interfacial oxide (e.g., silicon oxide (SiOx) which may include other chemical elements in it such as nitrogen (N), germanium (Ge), etc.) can first be formed on the surface of the SOI (channel) layer 106', and the gate dielectric 1006 can then be deposited over the interfacial oxide using a process such as CVD, ALD, or PVD.

Suitable materials for the gate dielectric 1006 include, but are not limited to, silicon oxide (SiOx), SiN, silicon oxynitride (SiOxNy), high-κ materials, or any combination thereof. Suitable high-κ materials include, but are not limited to, metal oxides such as hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$) and/or lead zinc niobite (Pb(Zn,Nb)O). The high-κ material can further include dopants such as lanthanum (La), aluminum (Al) and/or magnesium (Mg). The gate dielectric 1006 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 1006 has a thickness of from about 1 nm to about 5 nm and ranges therebetween.

Suitable materials for the gate conductor 1008 include, but are not limited to, doped polysilicon and/or at least one workfunction-setting metal. Suitable workfunction-setting metals include, but are not limited to, titanium nitride (TiN), titanium aluminide (TiAl), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC), titanium aluminum carbide (TiAlC), tantalum carbide (TaC) and/or hafnium carbide (HfC). The gate conductor 1008 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 1008 has a thickness of from about 5 nm to about 15 nm and ranges therebetween. In the exemplary embodiment shown illustrated in FIGS. 10A-C, the gate conductor 1008 includes at least one layer 1008*a* of the above workfunction-setting metal(s) and a (low-resistance) fill metal 1008*b* disposed over the layer(s) 1008*a* of workfunction-setting metal(s). Suitable low-resistance fill metals 1008*b* include, but are not limited to, tungsten (W) and/or aluminum (Al) which can be deposited using a process or combination of processes such as, but not limited to, CVD, ALD, PVD, sputtering, plating, evaporation, ion beam deposition, electron beam deposition, laser assisted deposition, chemical solution deposition, etc.

As provided above, a backside process is leveraged herein to fabricate the present double gate MOSFET device. Specifically, the device structure will next be mounted to a control wafer and then flipped, which will enable the fabrication of another gate on the backside of the structure. The term 'backside' refers to a side of the device structure opposite the gate(s) 1002. For instance, to look at it another way, it can be said that the gate(s) 1002 are formed on a (first) front side of the SOI (channel) layer 106'. In that case, the backside is a (second) side of the SOI (channel) layer 106' opposite the first/front side of the SOI (channel) layer 106'. See, e.g., FIG. 10C.

Namely, a dielectric layer 1102 is deposited onto the ILD 802 over gate spacers 602/gate(s) 1002, and standard wafer bonding techniques are used to attach a control wafer 1104 to the dielectric layer 1102. See FIG. 11 (a B-B' cross-sectional view). Suitable materials for dielectric layer 1102 include, but are not limited to, oxide materials such as SiOx, which can be deposited using a process such as CVD, ALD or PVD. According to an exemplary embodiment, the dielectric layer 1102 is deposited to a thickness of from about 5 nm to about 20 nm and ranges therebetween. Attachment of the control wafer 1104 to the front side will enable the device structure to be secured while the substrate 102 and buried insulator 104 are removed, and further processing is performed on the backside of the device structure.

Figure 11:
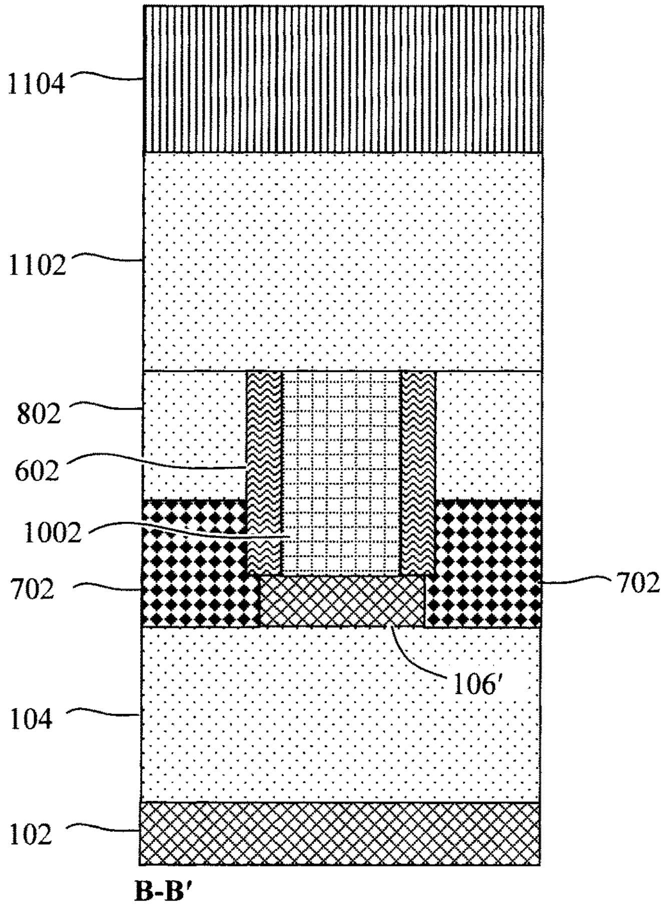
FIG. 11 is a B-B' cross-sectional view illustrating a (first) dielectric layer having been deposited onto the ILD over gate spacers/first gate(s), and a (first) control wafer having been attached to the first dielectric layer according to an embodiment of the present invention.
Figure 12:
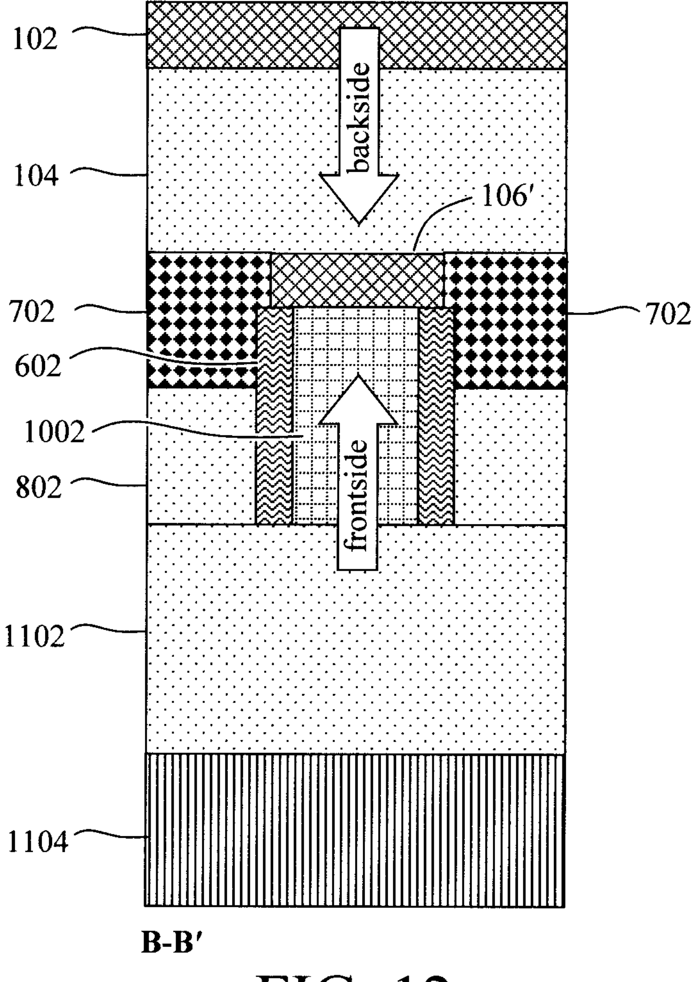
FIG. 12 is a B-B' cross-sectional view illustrating the device structure having been flipped over according to an embodiment of the present invention.

Namely, the device structure (i.e., including the substrate 102, buried insulator 104, SOI (channel) layer 106', gate spacers 602/gate(s) 1002, source/drain regions 702, ILD 802, dielectric layer 1102 and control wafer 1104) is then flipped over. See FIG. 12 (a B-B' cross-sectional view). By 'flipped over' it is meant that the components at the bottom of the device structure are now at the top, and vice versa. For instance, comparing FIG. 11 (prior to flipping the device structure over) and FIG. 12 (after the device structure has been flipped over), it can be seen that the substrate 102, which is at the bottom of the device structure in FIG. 11 is now at the top in FIG. 12. Conversely, the control wafer 1104, which is at the top of the device structure in FIG. 11 is now at the bottom in FIG. 12. However, the designations of 'frontside' and 'backside' (see above) remain the same. Notably, the first side or 'frontside' is the side of the device structure on which the gate(s) 1002 are formed, and the second side or 'backside' is the side of the device structure opposite the gate(s) 1002. See FIG. 12.

To enable backside processing, the substrate 102 and buried insulator 104 are next selectively removed, exposing the underlying SOI (channel) layer 106' and source/drain regions 702. See FIG. 13 (a B-B' cross-sectional view). By way of example only, the substrate 102 and buried insulator 104 can be removed using a process such as CMP and/or a selective recess etch, stopping on the SOI (channel) layer 106'/source/drain regions 702.

Figures 13, 14:
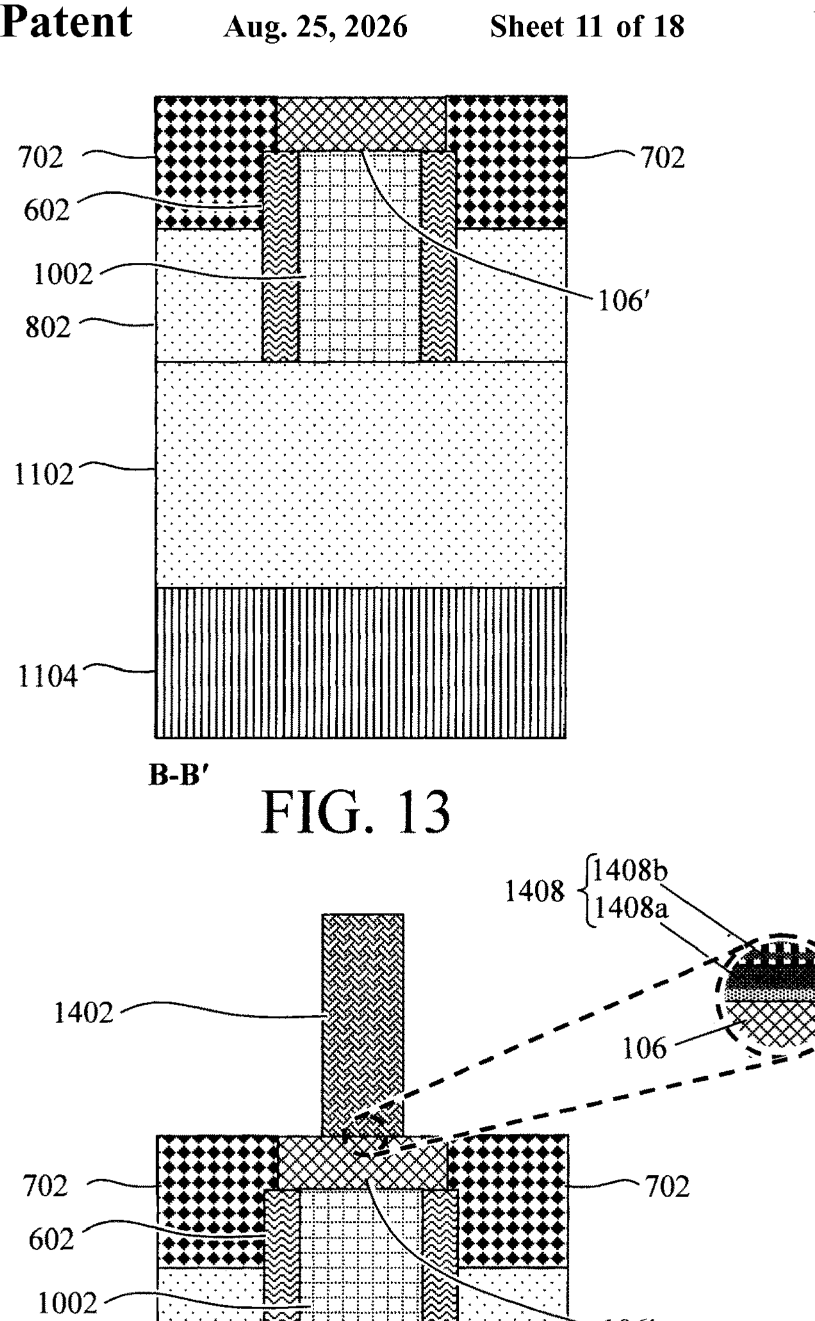
FIG. 13 is a B-B' cross-sectional view illustrating a substrate and buried insulator of the SOI wafer having been selectively removed, exposing the underlying SOI (channel) layer and source/drain regions according to an embodiment of the present invention.
FIG. 14 is a B-B' cross-sectional view illustrating a (second) gate(s) having been formed on a side of the SOI (channel) layer opposite the first gate(s), the second gate(s) having a different workfunction from the first gate(s) according to an embodiment of the present invention.

Gate(s) 1402 is/are formed on a side of the SOI (channel) layer 106' opposite the gate(s) 1002. See FIG. 14 (a B-B' cross-sectional view). For clarity, the terms 'first' and 'second' may be used herein when referring to gate(s) 1002 and gate(s) 1402, respectively. SOI (channel) layer 106' has a first side and a second side opposite the first side and, as shown in FIG. 14, (first) gate(s) 1002 is/are formed on the first side of the SOI (channel) layer 106', and the (second) gate(s) 1402 is/are formed on the second side of the SOI (channel) layer 106' directly opposite the first gate(s) 1002. Since the source/drain regions 702 have already been formed, a standard gate-first approach can be employed to fabricate gate(s) 1402, whereby the respective gate materials (see below) are deposited and patterned to form gate(s) 1402.

As shown in magnified view 1404, according to an exemplary embodiment, each of the gate(s) 1402 includes a gate dielectric 1406 and a gate conductor 1408 disposed on the gate dielectric 1406. Although not explicitly shown, a thin (e.g., from about 0.3 nm to about 5 nm) interfacial oxide (e.g., SiOx which may include other chemical elements in it such as N, Ge, etc.) can first be formed on the (backside) surface of the SOI (channel) layer 106', and the gate dielectric 1406 can then be deposited over the interfacial oxide using a process such as CVD, ALD, or PVD.

Suitable materials for the gate dielectric 1406 include, but are not limited to, SiOx, SiN, SiOxNy, high-κ materials, or any combination thereof. As provided above, suitable high-κ materials include, but are not limited to, metal oxides such as $HfO_2$, HfSiO, HfSiO, $La_2O_3$, $LaAlO_3$, $ZrO_2$, $ZrSiO_4$, ZrSiOxNy, TaOx, TiO, $BaO_6SrTi_2$, $BaTiO_3$, $SrTiO_3$, $Y_2O_3$, $Al_2O_3$, $Pb(Sc,Ta)O_3$ and/or Pb(Zn,Nb)O. The high-κ material can further include dopants such as La, Al and/or Mg. The gate dielectric 1406 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 1406 has a thickness of from about 1 nm to about 5 nm and ranges therebetween.

Suitable materials for the gate conductor 1408 include, but are not limited to, doped polysilicon and/or at least one workfunction-setting metal. As provided above, suitable workfunction-setting metals include, but are not limited to, TiN, TiAl, TiAlN, HfN, HfSiN, TaN, TaSiN, WN, MoN, NbN, TiC, TiAlC, TaC and/or HfC. The gate conductor 1408 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 1408 has a thickness of from about 5 nm to about 15 nm and ranges therebetween. In the exemplary embodiment shown illustrated in FIG. 14, the gate conductor 1408 includes at least one layer **1408*a* of the above workfunction-setting metal(s) and a (low-resistance) fill metal 1408*b* disposed over the layer(s) 1408*a* of workfunction-setting metal(s). As provided above, suitable low-resistance fill metals 1408*b*** include, but are not limited to, W and/or Al which can be deposited using a process or combination of processes such as, but not limited to, CVD, ALD, PVD, sputtering, plating, evaporation, ion beam deposition, electron beam deposition, laser assisted deposition, chemical solution deposition, etc.

Reference will be made herein to the configurations of the first and second gates 1002 and 1402 which can include, but are not limited to, the specific materials employed in the first and second gates 1002 and 1402, the combination of the materials employed in the first and second gates 1002 and 1402 and/or the properties (e.g., dimensions such as thickness) of the materials employed in the first and second gates 1002 and 1402, etc. Optionally, the same material or same combination of materials can be used in both the first and second gates 1002 and 1402. In that case, these 'alike configured' first and second gates 1002 and 1402 will at least partially surround the channel in a GAA configuration, and a common contact for the first and second gates 1002 and 1402 can be employed for a high performance MOSFET design. An exemplary embodiment, leveraging the present backside process-based techniques for creating a GAA MOSFET design is described in accordance with the description of FIGS. 18-21, below.

Alternatively, the first and second gates 1002 and 1402 can instead be configured differently from one another. Doing so enables one to vary the threshold voltage of the device based on the configuration of the first gate(s) 1002 relative to the second gate(s) 1402, and vice versa. In that case, separate contacts for the first and second gates 1002 and 1402 can be employed for a low power variable threshold voltage MOSFET.

The threshold voltage of a MOSFET device is the gate voltage required to turn the transistor on. The threshold voltage of a MOSFET device is defined by, among other things, the workfunction of the gate relative to the workfunction of the channel. Thus, in the present example, at least one of the above-mentioned factors, i.e., the specific materials employed in the first gate(s) 1002 versus the second gate(s) 1402, the combination of the materials employed in the first gate(s) 1002 versus the second gate(s) 1402, the properties of the materials employed in the first gate(s) 1002 versus the second gate(s) 1402, etc. is chosen to vary the workfunction of the first gate(s) 1002 relative to the workfunction of the second gate(s) 1402 thereby creating a variable threshold voltage MOSFET device.

For example, the workfunction varies amongst the exemplary gate conductor 1008/1408 materials provided above. For instance, by way of example only, aluminum (Al) has a workfunction of about 4.1 electron volts (eV), whereas titanium nitride (TiN) has a workfunction of about 5.0 eV. Thus, simply varying the material(s) chosen as the gate conductor 1008 relative to the material(s) chosen for the gate conductor 1408 can be used to create a difference in the workfunction of the first gate(s) 1002 versus the workfunction of the second gate(s) 1402.

Further, employing different combinations of the above exemplary gate conductor 1008/1408 materials can be used to create a difference in the workfunction of the first gate(s) 1002 versus the workfunction of the second gate(s) 1402. For instance, by way of example only, a combination of TaN and TiAl is suitable for the gate in an n-channel MOS (NMOS) FET which requires a workfunction close to the conduction band of Si (about 4.1 eV), whereas a combination of TaN, TiN and TiAl is suitable for the gate in an p-channel MOS (NMOS) FET which requires a workfunction close to the Si valence band (about 5.0 eV).

The properties of the gate materials such as thickness can also play a part in gate workfunction tuning. For instance, by way of example only, TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents.

It is assumed for remainder of the process flow that, in the present example, the first gate(s) 1002 has a different workfunction from the second gate(s) 1402 so as to create a variable threshold voltage MOSFET device. Steps will be now taken to fabricate separate gate contacts for independent control of the first and second gates 1002 and 1402. As will be described in detail below, this will involve flipping the device structure over in order to enable the gate contacts to be formed from the top-down that independently access the first and second gates 1002 and 1402.

To do so, a dielectric layer 1502 is next deposited onto (the backside) of the SOI (channel) layer 106' and source/drain regions 702 over the second gate(s) 1402, and standard wafer bonding techniques are used to attach a control wafer 1504 to the dielectric layer 1502. See FIG. 15 (a B-B' cross-sectional view). For clarity, the terms ‘first’ and ‘second’ may also be used herein when referring to dielectric layer 1102 and dielectric layer 1502, respectively, and when referring to control wafer 1104 and control wafer 1504, respectively. Suitable materials for dielectric layer 1502 include, but are not limited to, oxide materials such as SiOx, which can be deposited using a process such as CVD, ALD or PVD. According to an exemplary embodiment, the dielectric layer 1502 is deposited to a thickness of from about 5 nm to about 20 nm and ranges therebetween.

Figure 15:
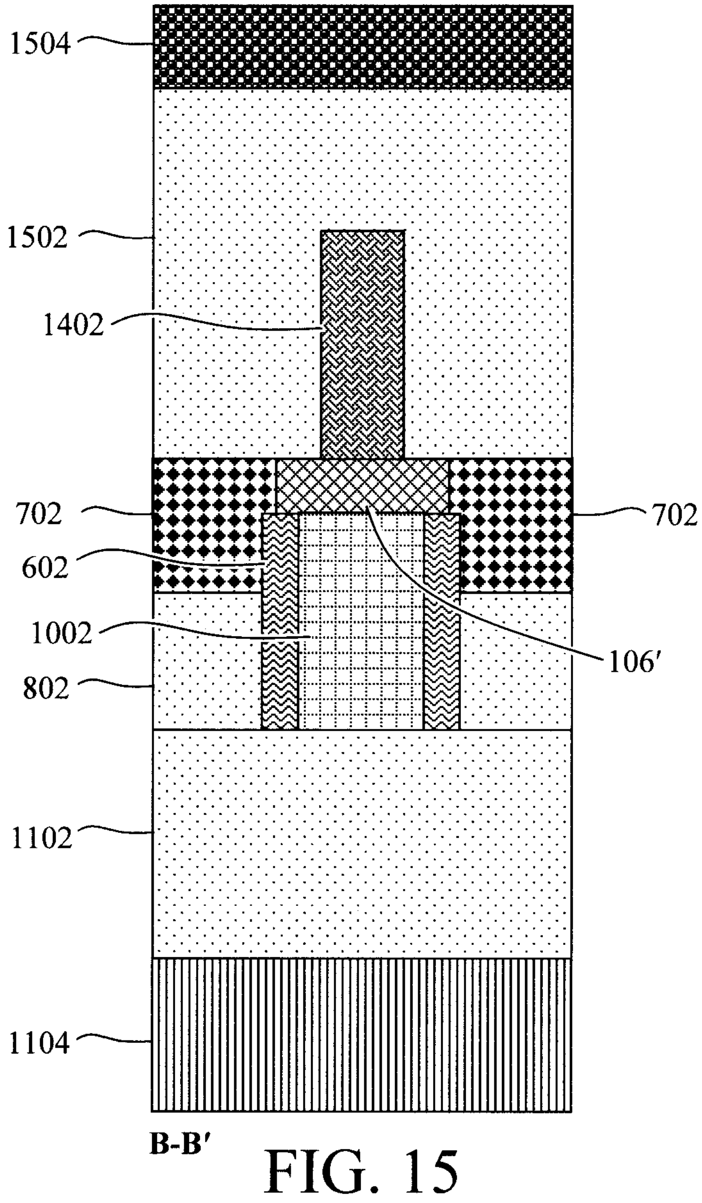
FIG. 15 is a B-B' cross-sectional view illustrating a (second) dielectric layer having been deposited onto (the backside) of the SOI (channel) layer and source/drain regions over the second gate(s), and a (second) control wafer having been attached to the second dielectric layer according to an embodiment of the present invention.

The current device structure (i.e., including the dielectric layer 1102, control wafer 1104, ILD 802, SOI (channel) layer 106', gate spacers 602/first gate(s) 1002, source/drain regions 702, second gate(s) 1402, dielectric layer 1502 and control wafer 1504) is then flipped over. See FIG. 16 (a B-B' cross-sectional view). As above, by ‘flipped over’ it is meant that the components at the bottom of the device structure are now at the top, and vice versa. For instance, comparing FIG. 15 (prior to flipping the current device structure over) and FIG. 16 (after the current device structure has been flipped over), it can be seen that the control wafer 1104, which is at the bottom of the device structure in FIG. 15 is now at the top in FIG. 16. Conversely, the control wafer 1504, which is at the top of the device structure in FIG. 15 is now at the bottom in FIG. 16. However, the above-described designations of ‘frontside’ and ‘backside’ remain the same. Notably, the first side or ‘frontside’ is the side of the current device structure on which the first gate(s) 1002 are formed, and the second side or ‘backside’ is the side of the current device structure (opposite the gate(s) 1002) on which the second gate(s) 1402 are formed. See FIG. 16.

Figure 16:
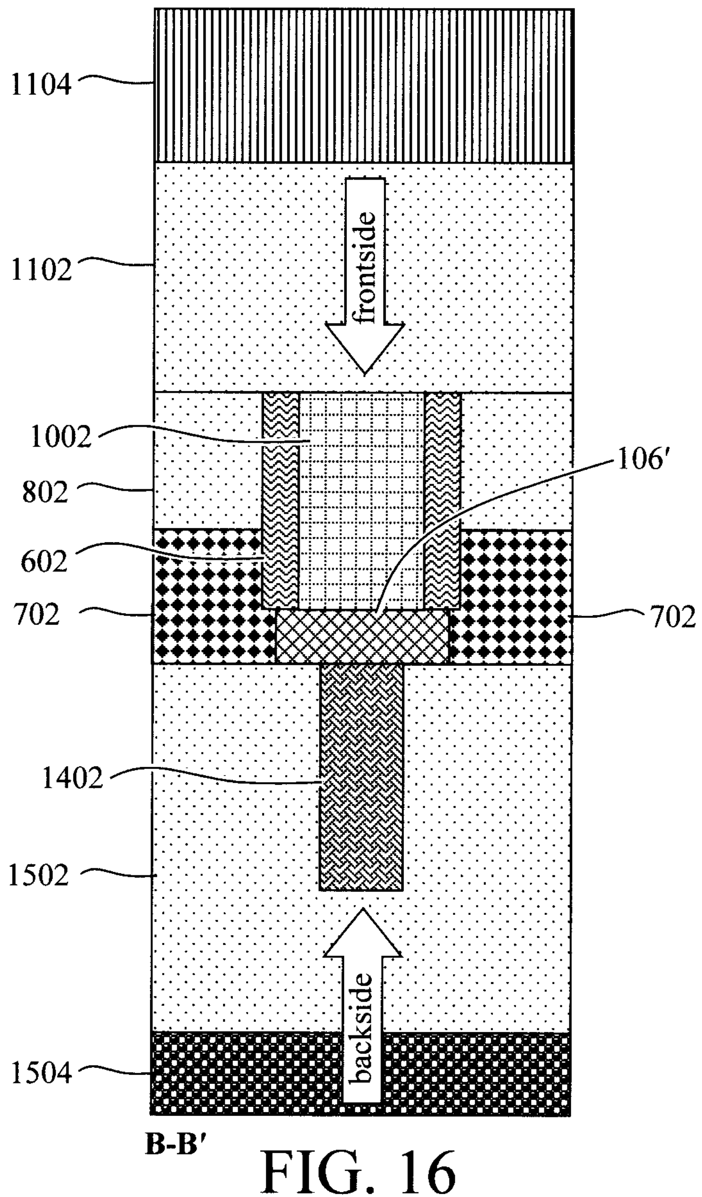
FIG. 16 is a B-B' cross-sectional view illustrating the device structure having been flipped over according to an embodiment of the present invention.

Some notable features of the present MOSFET device structure are depicted in FIG. 16. For instance, referring to FIG. 16 it can be seen that the first gate(s) 1002 is/are in direct contact with a first side of the SOI (channel) layer 106' and the second gate(s) 1402 is/are in direct contact with a second side of the SOI (channel) layer 106' directly opposite the first gate(s) 1002. Based on the above-described process, the source/drain regions 702 are present in the SOI (channel) layer 106' on opposite sides of the first gate(s) 1002, and the bottom surface of the source/drain regions 702 is substantially coplanar with the second side of the SOI (channel) layer 106'. By ‘substantially coplanar’ it is meant that the bottom (backside) surface of the source/drain regions 702 is offset from the second side of the SOI (channel) layer 106' by less than or equal to about 0.5 nm. The top (frontside) surface of the source/drain regions 702 is present alongside the first gate(s) 1002, offset from the first gate(s) 1002 by gate spacers 602. Dielectric layer 1102 is in direct contact with the first gate(s) 1002 and gate spacers 602 at the frontside of the device, and dielectric layer 1502 is in direct contact with the SOI (channel) layer 106', source/drain regions 702 and second gate(s) 1402 at the backside of the device.

Figure 17:
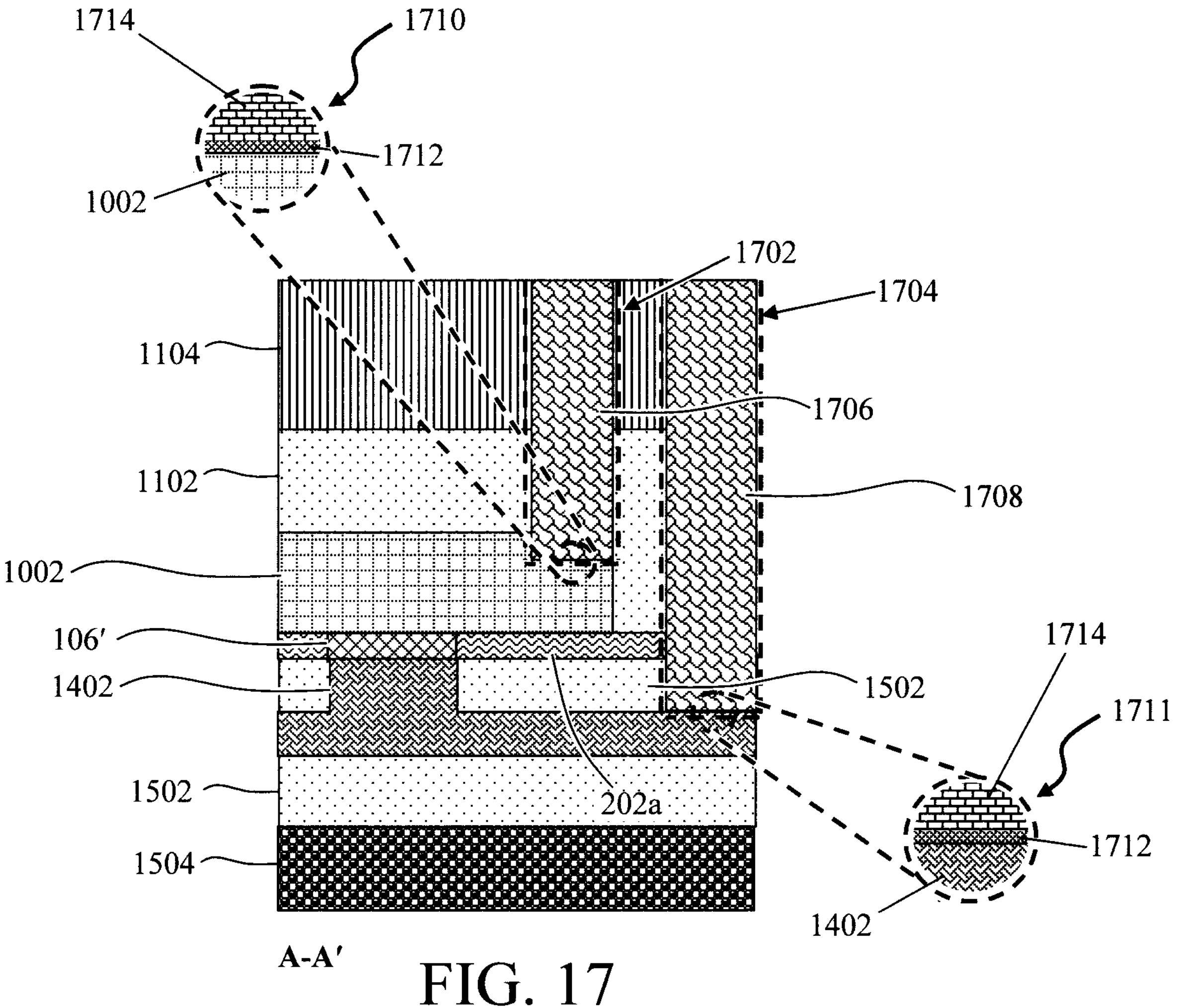
FIG. 17 is an A-A' cross-sectional view illustrating first and second gate contacts having been formed to the first gate(s) and second gate(s), respectively, according to an embodiment of the present invention.

First and second gate contacts 1706 and 1708 are then formed to the first gate(s) 1002 and second gate(s) 1402, respectively. See FIG. 17 (an A-A' cross-sectional view). As shown in FIG. 17, the first gate contact is in direct contact with the first gate(s) 1002 and the second gate contact 1708 is in direct contact with the second gate(s) 1402. This configuration of the gate contacts 1706 and 1708 permits independent control of the first gate(s) 1002 and second gate(s) 1402, respectively. As provided above, the first gate(s) 1002 and second gate(s) 1402 can be configured to have a different workfunction from one another. In that case, the resulting device is a variable threshold MOSFET device which is well suited for low power applications.

To form the first and second gate contacts 1706 and 1708, standard lithography and etching techniques (see above) can first be employed to pattern gate contact trenches 1702 and 1704 (shown outlined in dashed lines) extending through the dielectric layer 1102 and control wafer 1104 down to the first gate(s) 1002 and the second gate(s) 1402, respectively. As shown in FIG. 17, the gate contact trench 1704 additionally passes through the patterned dielectric material **202*a* and dielectric layer 1502**.

The gate contact trenches 1702 and 1704 are then filled with a metal or a combination of metals to form the first and second gate contacts 1706 and 1708, respectively. As shown in magnified views 1710 and 1711, according to an exemplary embodiment, each of the first and second gate contacts 1706 and 1708 includes an adhesion/barrier layer 1712 lining the gate contact trenches 1702 and 1704, and a conductive fill metal 1714 disposed on the adhesion/barrier layer 1712. Suitable materials for the adhesion/barrier layer 1712 include, but are not limited to, tantalum (Ta), tantalum nitride (TaN), titanium (Ti) and/or titanium nitride (TiN). The use of an adhesion/barrier layer helps to prevent diffusion of the contact metals into the surrounding dielectric. Suitable conductive fill metals 1714 include, but are not limited to, copper (Cu), tungsten (W), ruthenium (Ru) and/or cobalt (Co). The adhesion/barrier layer 1712 and conductive fill metal 1714 can be deposited into the gate contact trenches 1702 and 1704 using a process such as evaporation, sputtering, ALD, CVD or electrochemical plating. Additionally, a seed layer (not shown) can be deposited into and lining the gate contact trenches 1702 and 1704 prior to metal deposition, i.e., to facilitate plating of the metal. Following deposition, excess metal can be removed using a process such as CMP.

Some notable features of the present MOSFET device structure are depicted in FIG. 17. For instance, from this cross-sectional view (A-A') it can be seen that the patterned dielectric material **202*a* is present in between the first gate(s) 1002 and the second gate(s) 1402, and is in direct contact with the first gate(s) 1002 and the dielectric layer 1502. While like structures are numbered alike throughout the description and drawings, the dimensions of some structures might be scaled in some figures (such as in FIG. 17**) merely for ease and clarity of depiction.

Figure 18:
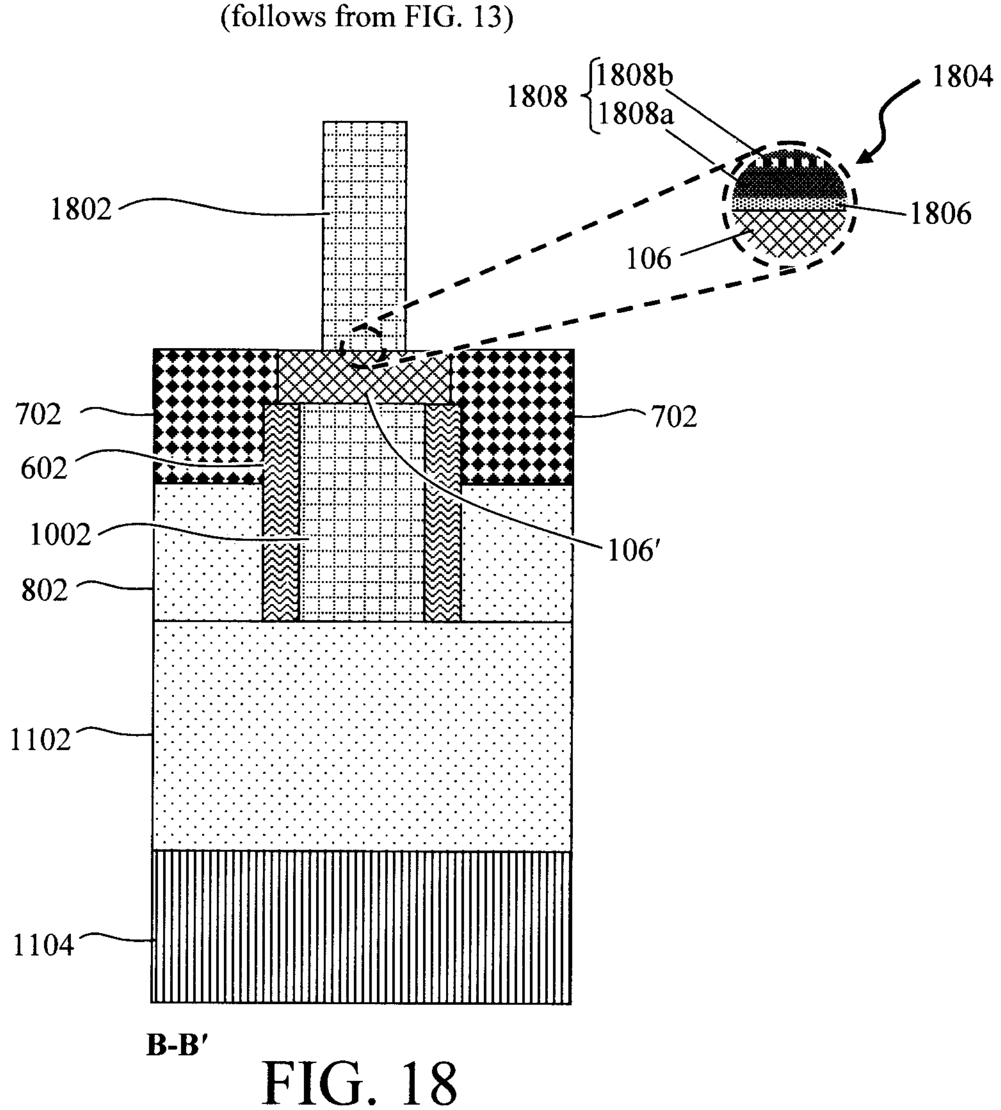
FIG. 18 is a B-B' cross-sectional view illustrating a (second) gate(s) having been formed on a side of the SOI (channel) layer opposite the first gate(s), the second gate(s) having a same workfunction as the first gate(s) according to an embodiment of the present invention.

As described above, the same backside process can be used to produce a GAA MOSFET device with minor adjustments to the configuration of the gates and the gate contacts accordingly. An exemplary embodiment for fabricating a GAA MOSFET device in accordance with the present techniques is now described by way of reference to FIGS. 18-21. Since the same general backside process is employed, there is significant overlap with the example described above. Namely, the process proceeds in exactly the same manner up to the formation of the second gate(s) as described in conjunction with the description of FIGS. 1-13 above. Namely, the device structure (i.e., including the SOI (channel) layer 106', gate spacers 602/gate(s) 1002, source/drain regions 702, ILD 802, dielectric layer 1102 and control wafer 1104) is formed in exactly the same manner as described above. Thus, what is depicted in FIG. 18 follows from the device structure shown in FIG. 13. Like structures are numbered alike in the figures.

Here, however, unlike the example above, the first gate(s) 1002 and a (second) gate(s) 1802 are configured alike (i.e., gate(s) 1002 and gate(s) 1802 include the same material or same combination of materials). See FIG. 18 (a B-B' cross-sectional view). To look at it another way, according to an exemplary embodiment, a workfunction of the gate(s) 1002 is the same as a workfunction of the gate(s) 1802. These 'alike configured' first and second gates 1002 and 1802 will at least partially surround the SOI (channel) layer 106' in a GAA configuration and, as will be described in detail below, a common contact for the first and second gates 1002 and 1802 will be employed for a high performance MOSFET design.

As shown in FIG. 18, gate(s) 1802 is/are formed on a side of the SOI (channel) layer 106' opposite the gate(s) 1002. Using the same designations as above, SOI (channel) layer 106' has a first side and a second side opposite the first side and, as shown in FIG. 18, (first) gate(s) 1002 is/are formed on the first side of the SOI (channel) layer 106', and the (second) gate(s) 1802 is/are formed on the second side of the SOI (channel) layer 106' directly opposite the first gate(s) 1002.

As shown in magnified view 1804, according to an exemplary embodiment, like gate(s) 1002 each of the gate(s) 1802 includes a gate dielectric 1806 and a gate conductor 1808 disposed on the gate dielectric 1806. Although not explicitly shown, a thin (e.g., from about 0.3 nm to about 5 nm) interfacial oxide (e.g., SiOx which may include other chemical elements in it such as N, Ge, etc.) can first be formed on the (backside) surface of the SOI (channel) layer 106', and the gate dielectric 1806 can then be deposited over the interfacial oxide using a process such as CVD, ALD, or PVD.

Like those materials presented above for gate(s) 1002, suitable materials for the gate dielectric 1806 include, but are not limited to, SiOx, SiN, SiOxNy, high-κ materials, or any combination thereof. As provided above, suitable high-κ materials include, but are not limited to, metal oxides such as $HfO_2$, HfSiO, HfSiO, $La_2O_3$, $LaAlO_3$, $ZrO_2$, $ZrSiO_4$, ZrSiOxNy, TaOx, TiO, $BaO_6SrTi_2$, $BaTiO_3$, $SrTiO_3$, $Y_2O_3$, $Al_2O_3$, $Pb(Sc,Ta)O_3$ and/or Pb(Zn,Nb)O. The high-κ material can further include dopants such as La, Al and/or Mg. The gate dielectric 1806 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 1806 has a thickness of from about 1 nm to about 5 nm and ranges therebetween.

Like those materials presented above for gate(s) 1002, suitable materials for the gate conductor 1808 include, but are not limited to, doped polysilicon and/or at least one workfunction-setting metal. As provided above, suitable workfunction-setting metals include, but are not limited to, TiN, TiAl, TiAlN, HfN, HfSiN, TaN, TaSiN, WN, MoN, NbN, TiC, TiAlC, TaC and/or HfC. The gate conductor 1808 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 1808 has a thickness of from about 5 nm to about 15 nm and ranges therebetween. In the exemplary embodiment shown illustrated in FIG. 18, the gate conductor 1808 includes at least one layer **1808*a* of the above workfunction-setting metal(s) and a (low-resistance) fill metal 1808*b* disposed over the layer(s) 1808*a* of workfunction-setting metal(s). As provided above, suitable low-resistance fill metals 1808*b* include, but are not limited to, W and/or Al which can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate(s) 1002 and gate(s) 1802** employ the same combination of materials for use as the gate dielectric and gate conductor (including the same workfunction-setting metal(s) and low-resistance fill metal(s).

Steps will be now taken to fabricate a common gate contact for the first and second gates 1002 and 1802 which will enable the first and second gates 1002 and 1802 to perform in a GAA configuration for high performance applications. The same general process as that employed above will be implemented including flipping the device structure over in order to enable the gate contact to be formed from the top-down that accesses both the first and second gates 1002 and 1802.

To do so, a dielectric layer 1902 is next deposited onto (the backside) of the SOI (channel) layer 106' and source/drain regions 702 over the second gate(s) 1802, and standard wafer bonding techniques are used to attach a control wafer 1904 to the dielectric layer 1902. See FIG. 19 (a B-B' cross-sectional view). For clarity, the terms 'first' and 'second' may also be used herein when referring to dielectric layer 1102 and dielectric layer 1902, respectively, and when referring to control wafer 1104 and control wafer 1904, respectively. Suitable materials for dielectric layer 1902 include, but are not limited to, oxide materials such as SiOx, which can be deposited using a process such as CVD, ALD or PVD. According to an exemplary embodiment, the dielectric layer 1902 is deposited to a thickness of from about 5 nm to about 20 nm and ranges therebetween.

Figure 19:
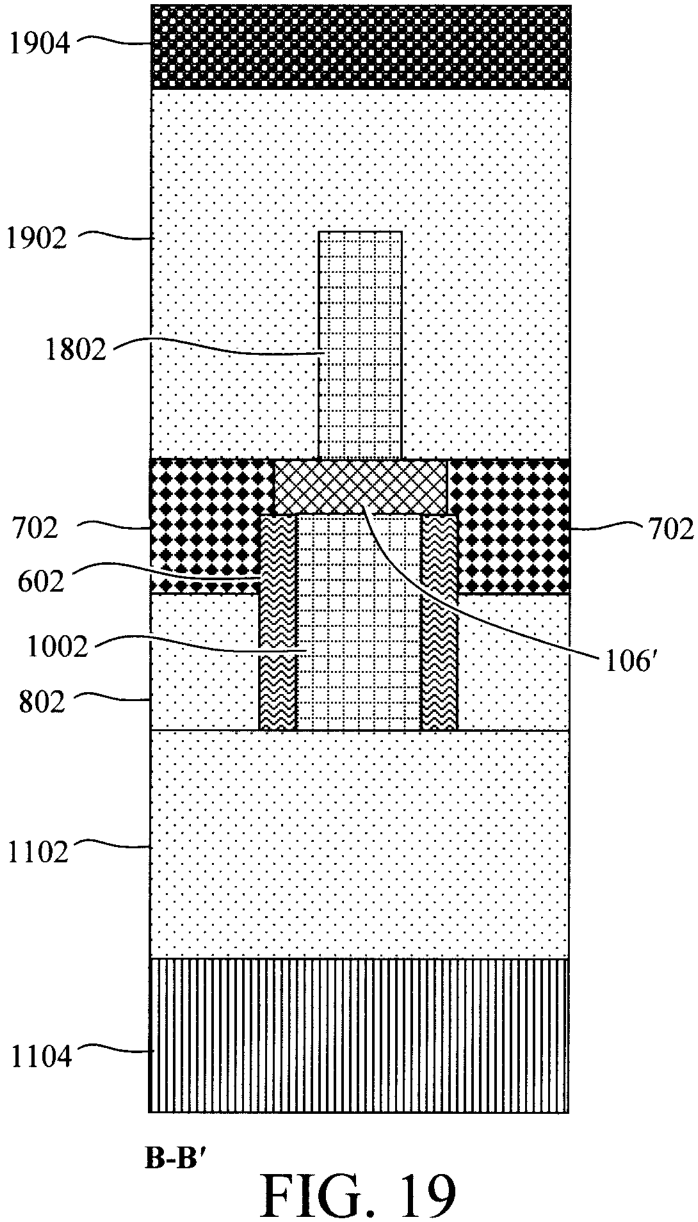
FIG. 19 is a B-B' cross-sectional view illustrating a (second) dielectric layer having been deposited onto (the backside) of the SOI (channel) layer and source/drain regions over the second gate(s), and a (second) control wafer having been attached to the second dielectric layer according to an embodiment of the present invention.

The current device structure (i.e., including the dielectric layer 1102, control wafer 1104, ILD 802, SOI (channel) layer 106', gate spacers 602/first gate(s) 1002, source/drain regions 702, second gate(s) 1802, dielectric layer 1902 and control wafer 1904) is then flipped over. See FIG. 20 (a B-B' cross-sectional view). As above, by 'flipped over' it is meant that the components at the bottom of the device structure are now at the top, and vice versa. For instance, comparing FIG. 19 (prior to flipping the current device structure over) and FIG. 20 (after the current device structure has been flipped over), it can be seen that the control wafer 1104, which is at the bottom of the device structure in FIG. 19 is now at the top in FIG. 20. Conversely, the control wafer 1904, which is at the top of the device structure in FIG. 19 is now at the bottom in FIG. 20. However, the above-described designations of 'frontside' and 'backside' remain the same. Notably, the first side or 'frontside' is the side of the current device structure on which the first gate(s) 1002 are formed, and the second side or 'backside' is the side of the current device structure (opposite the gate(s) 1002) on which the second gate(s) 1802 are formed. See FIG. 20.

Figure 20:
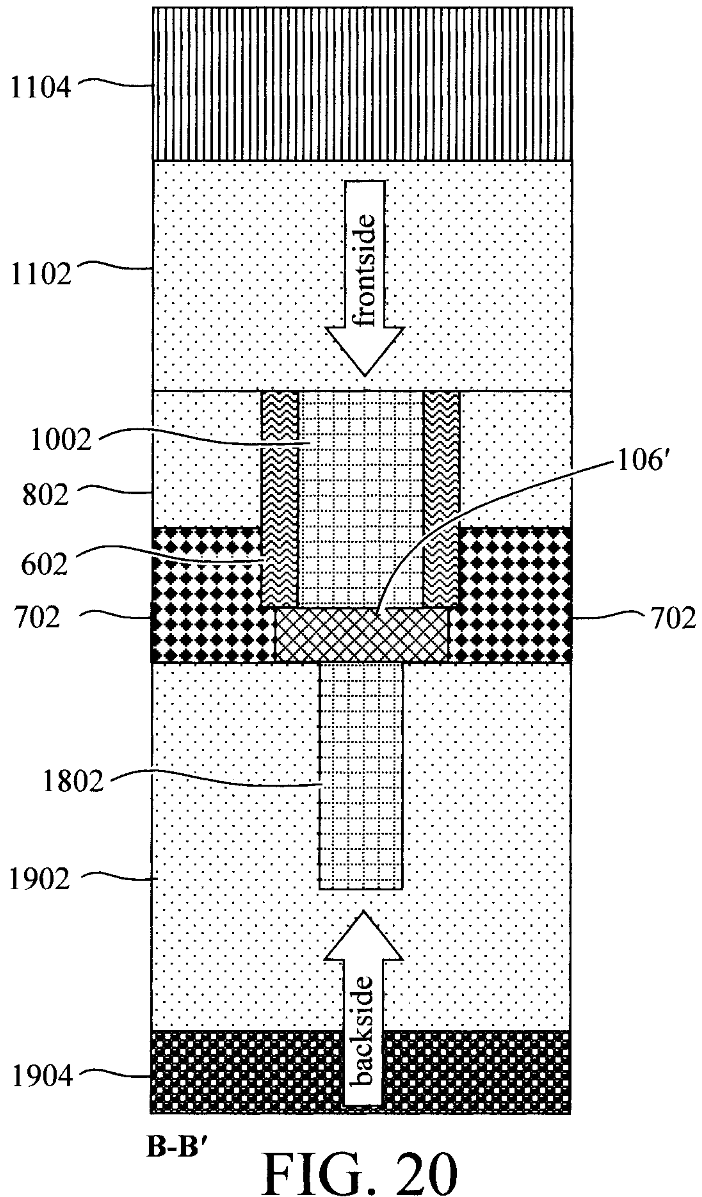
FIG. 20 is a B-B' cross-sectional view illustrating the device structure having been flipped over according to an embodiment of the present invention.

Some notable features of the present MOSFET device structure are depicted in FIG. 20. For instance, referring to FIG. 20 it can be seen that the first gate(s) 1002 is/are in direct contact with a first side of the SOI (channel) layer 106' and the second gate(s) 1802 is/are in direct contact with a second side of the SOI (channel) layer 106' directly opposite the first gate(s) 1002. Based on the above-described process, the source/drain regions 702 are present in the SOI (channel) layer 106' on opposite sides of the first gate(s) 1002, and the bottom surface of the source/drain regions 702 is substantially coplanar with the second side of the SOI (channel) layer 106'. As provided above, by 'substantially coplanar' it is meant that the bottom (backside) surface of the source/drain regions 702 is offset from the second side of the SOI (channel) layer 106' by less than or equal to about 0.5 nm. The top (frontside) surface of the source/drain regions 702 is present alongside the first gate(s) 1002, offset from the first gate(s) 1002 by gate spacers 602. Dielectric layer 1102 is in direct contact with the first gate(s) 1002 and gate spacers 602 at the frontside of the device, and dielectric layer 1902 is in direct contact with the SOI (channel) layer 106', source/drain regions 702 and second gate(s) 1802 at the backside of the device.

Figure 21:
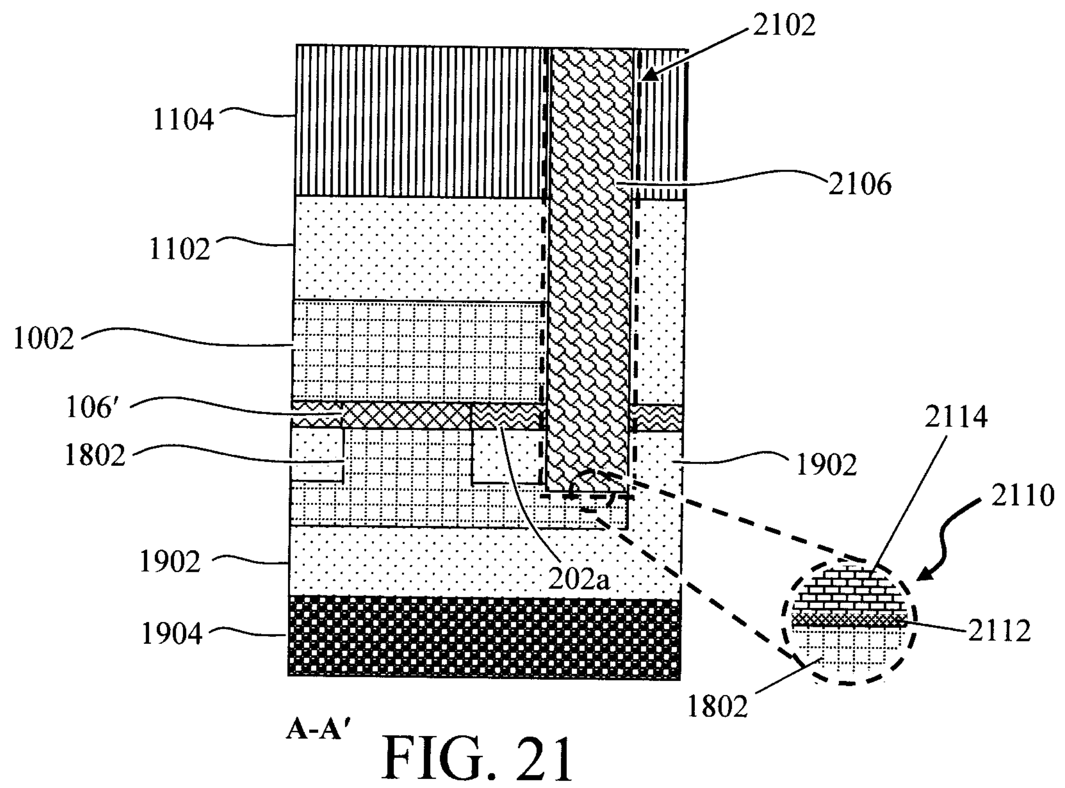
FIG. 21 is an A-A' cross-sectional view illustrating a single (common) gate contact having been formed to the first gate(s) and second gate(s) according to an embodiment of the present invention.

A single (common) gate contact 2106 is then formed to the first gate(s) 1002 and second gate(s) 1802. See FIG. 21 (an A-A' cross-sectional view). As shown in FIG. 21, gate contact 2106 is in direct contact with both the first gate(s) 1002 and the second gate(s) 1802. This configuration of gate contact 2106 permits the first gate(s) 1002 and second gate(s) 1802 to operate together in a GAA configuration, which is well suited for high performance applications.

To form the gate contact 2106, standard lithography and etching techniques (see above) can first be employed to pattern a gate contact trench 2102 (shown outlined in dashed lines) extending through the dielectric layer 1102, control wafer 1104, the patterned dielectric material **202*a* and dielectric layer 1902, alongside the first gate(s) 1002 and down to the second gate(s) 1802. The gate contact trench 2102 is then filled with a metal or a combination of metals to form the gate contact 2106. As shown in magnified view 2110, according to an exemplary embodiment, the gate contact 2106 includes an adhesion/barrier layer 2112 lining the gate contact trench 2102, and a conductive fill metal 2114 disposed on the adhesion/barrier layer 2112. Suitable materials for the adhesion/barrier layer 2112 include, but are not limited to, Ta, TaN, Ti and/or TiN. As provided above, the use of an adhesion/barrier layer helps to prevent diffusion of the contact metals into the surrounding dielectric. Suitable conductive fill metals 2114 include, but are not limited to, Cu, W, Ru and/or Co. The adhesion/barrier layer 2112 and conductive fill metal 2114 can be deposited into the gate contact trench 2102 using a process such as evaporation, sputtering, ALD, CVD or electrochemical plating. Additionally, a seed layer (not shown) can be deposited into and lining the gate contact trench 2102** prior to metal deposition, i.e., to facilitate plating of the metal. Following deposition, excess metal can be removed using a process such as CMP.

Some notable features of the present MOSFET device structure are depicted in FIG. 21. For instance, from this cross-sectional view (A-A') it can be seen that the patterned dielectric material **202*a* is present in between the first gate(s) 1002 and the second gate(s) 1802, and is in direct contact with the first gate(s) 1002 and the dielectric layer 1902. As provided above, while like structures are numbered alike throughout the description and drawings, the dimensions of some structures might be scaled in some figures (such as in FIG. 21**) merely for ease and clarity of depiction.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A metal oxide semiconductor field-effect transistor (MOSFET) device, comprising:
- a channel in between a source region and a drain region;
- a plurality of gates comprising:
  - a first gate disposed on a first side of the channel at a frontside of the MOSFET device; and
  - a second gate disposed on a second side of the channel directly opposite the first gate at a backside of the MOSFET device, wherein a portion of the first gate is located in between and physically separating the source region from the drain region; and
- gate spacers offsetting the first gate from the source region and the drain region, wherein:
  - the first gate is of a first width, the first width in a direction perpendicular to each of the gate spacers;
  - the second gate is of a second width, the second width parallel to the first width; and
  - the first width is greater than the second width.

2. The MOSFET device of claim 1, wherein the MOSFET device has a gate-all-around configuration, and wherein the first gate comprises a selection from the group consisting of: (i) a same material and (ii) a same combination of materials, as the second gate.

3. The MOSFET device of claim 1, wherein:
- the MOSFET device has a variable threshold configuration; and
- a workfunction of the first gate is different than a workfunction of the second gate.

4. The MOSFET device of claim 3, wherein the first gate comprises a selection from the group consisting of: (i) a different material and (ii) a different combination of materials, as the second gate.

5. The MOSFET device of claim 1, further comprising:
- a first dielectric layer disposed over the first gate and the gate spacers; and
- a first control wafer disposed on the first dielectric layer.

6. The MOSFET device of claim 5, further comprising:
- a second dielectric layer disposed over the second gate; and
- a second control wafer disposed on the second dielectric layer.

7. The MOSFET device of claim 1, wherein the first gate and the second gate each comprise:
- a gate dielectric; and
- a gate conductor disposed on the gate dielectric.

8. The MOSFET device of claim 7, wherein the gate conductor comprises:
- a layer of at least one workfunction-setting metal; and
- fill metal disposed over the layer of the at least one workfunction-setting metal.

9. The MOSFET device of claim 1, further comprising:
- a first gate contact in direct contact with the first gate; and
- a second gate contact in direct contact with the second gate.

10. The MOSFET device of claim 1, further comprising:
- a single gate contact in direct contact with both: the first gate and the second gate.

11. The MOSFET device of claim 1, wherein:

the gate spacers comprise a first gate spacer and a second gate spacer; and along the direction perpendicular to each of the gate spacers: the source region contacts the first gate spacer, the first gate spacer contacts the first gate, the first gate contacts the second gate spacer, and the second gate spacer contacts the drain region.

12. A metal oxide semiconductor field-effect transistor (MOSFET) device, comprising:

a channel in between a source region and a drain region;

a plurality of gates comprising:

a first gate disposed on a first side of the channel at a frontside of the MOSFET device; and a second gate disposed on a second side of the channel directly opposite the first gate at a backside of the MOSFET device, wherein a portion of the first gate is located in between and physically separating the source region from the drain region;

gate spacers offsetting the first gate from the source region and the drain region, wherein:

the first gate is of a first width, the first width in a direction perpendicular to each of the gate spacers;

the second gate is of a second width, the second width parallel to the first width; and the first width is greater than the second width; and a gate contact in direct contact with the first gate and the second gate.

13. The MOSFET device of claim 12, wherein the MOSFET device has a gate-all-around configuration, and wherein the first gate comprises a selection from the group consisting of: (i) a same material and (ii) a same combination of materials, as the second gate.

14. The MOSFET device of claim 13, wherein the gate contact comprises a single gate contact in direct contact with both: the first gate and the second gate.

15. The MOSFET device of claim 12, wherein:

the MOSFET device has a variable threshold configuration; and a workfunction of the first gate is different than a workfunction of the second gate.

16. The MOSFET device of claim 15, wherein the gate contact comprises: (i) a first gate contact in direct contact with the first gate and (ii) a second gate contact in direct contact with the second gate.

17. The MOSFET device of claim 12, further comprising:

a first dielectric layer disposed over the first gate and the gate spacers; and a first control wafer disposed on the first dielectric layer.

18. The MOSFET device of claim 17, further comprising:

a second dielectric layer disposed over the second gate; and a second control wafer disposed on the second dielectric layer.

19. A method of forming a metal oxide semiconductor field-effect transistor (MOSFET) device, the method comprising:

forming a sacrificial gate on a first side of a channel at a frontside of the MOSFET device;

forming gate spacers alongside the sacrificial gate;

forming a source region and a drain region on opposite sides of the sacrificial gate, offset from the sacrificial gate by the gate spacers;

removing and replacing the sacrificial gate with a first gate; and forming a second gate on a second side of the channel directly opposite the first gate at a backside of the MOSFET device, wherein:

a portion of the first gate is located in between and physically separating the source region from the drain region;

the first gate is of a first width, the first width in a direction perpendicular to each of the gate spacers;

the second gate is of a second width, the second width parallel to the first width; and the first width is greater than the second width.

20. The method of claim 19, wherein the first gate comprises a selection from the group consisting of: (i) a same material and a same combination of materials, as the second gate, further comprising:

forming a single gate contact in direct contact with both: (i) the first gate and (ii) the second gate.

* * * * *